United States Patent
Bromberger

(10) Patent No.: US 7,352,051 B2
(45) Date of Patent: Apr. 1, 2008

(54) CASCODE, CASCODE CIRCUIT AND METHOD FOR VERTICAL INTEGRATION OF TWO BIPOLAR TRANSISTORS INTO A CASCODE ARRANGEMENT

(75) Inventor: Christoph Bromberger, Heilbronn (DE)

(73) Assignee: Atmel Germany GmbH, Heilbronn (DE)

( * ) Notice: Subject to any disclaimer, the term of this patent is extended or adjusted under 35 U.S.C. 154(b) by 12 days.

(21) Appl. No.: 11/198,317

(22) Filed: Aug. 8, 2005

(65) Prior Publication Data

US 2006/0033183 A1  Feb. 16, 2006

(30) Foreign Application Priority Data

Aug. 10, 2004 (DE) ............ 10 2004 038 699

(51) Int. Cl.
*H01L 27/082* (2006.01)
(52) U.S. Cl. ............... 257/566; 257/587
(58) Field of Classification Search ........ 257/565, 257/566, 587
See application file for complete search history.

(56) References Cited

U.S. PATENT DOCUMENTS

| | | | |
|---|---|---|---|
| 4,651,410 A | 3/1987 | Feygenson | |
| 4,771,013 A | 9/1988 | Curran | |
| 4,812,890 A * | 3/1989 | Feygenson | ............ 257/74 |
| 5,329,145 A | 7/1994 | Nakagawa | |
| 5,399,899 A | 3/1995 | Dekker et al. | |
| 5,569,952 A | 10/1996 | Dekker et al. | |
| 5,684,308 A | 11/1997 | Lovejoy et al. | |
| 6,593,628 B2 | 7/2003 | Dekker et al. | |
| 2001/0045619 A1 | 11/2001 | Dekker et al. | |

FOREIGN PATENT DOCUMENTS

| | | |
|---|---|---|
| EP | 0 605 920 A1 | 7/1994 |
| EP | 0 646 960 A1 | 4/1995 |
| JP | 2-78267 | 3/1990 |

* cited by examiner

*Primary Examiner*—Mark V. Prenty
(74) *Attorney, Agent, or Firm*—Geissler, Olds & Lowe, PLLC

(57) ABSTRACT

A cascode of a high-frequency circuit, includes a first transistor having a first base semiconductor region, a first collector semiconductor region and a first emitter semiconductor region, and a second transistor having a second base semiconductor region, a second collector semiconductor region and a second emitter semiconductor region. The first emitter semiconductor region of the first transistor and the second collector semiconductor region of the second transistor are geometrically arranged on top with respect to a wafer surface, while the first collector semiconductor region of the first transistor and the second emitter semiconductor region of the second transistor are geometrically arranged on the bottom with respect to the wafer surface.

23 Claims, 1 Drawing Sheet

CASCODE, CASCODE CIRCUIT AND METHOD FOR VERTICAL INTEGRATION OF TWO BIPOLAR TRANSISTORS INTO A CASCODE ARRANGEMENT

This nonprovisional application claims priority under 35 U.S.C. § 119(a) on German Patent Application No. DE 2004038699.4, which was filed in Germany on Aug. 10, 2004, and which is herein incorporated by reference.

BACKGROUND OF THE INVENTION

1. Field of the Invention

The present invention relates to a cascode, a cascode circuit, and a method for vertical integration of two bipolar transistors into a cascode arrangement.

2. Description of the Background Art

A standard circuit used in many areas of circuit design is a cascode circuit, which is a series connection of a transistor in a common-emitter circuit and a transistor in a common-base circuit. Both bipolar transistors and field-effect transistors can be used as transistors.

SUMMARY OF THE INVENTION

It is an object of the present invention to provide a cascode, which is maximally suitable for high-frequency circuits.

A first transistor and a second transistor of a cascode circuit is integrated in one component, where the semiconductor region of the emitter of the first transistor and the semiconductor region of the collector of the second transistor are arranged on top with respect to a wafer surface. Accordingly, a cascode is provided which has a first transistor with a first base semiconductor region, a first collector semiconductor region and a first emitter semiconductor region, and has a second transistor with a second base semiconductor region, a second collector semiconductor region and a second emitter semiconductor region. In this regard, the first emitter semiconductor region of the first transistor and the second collector semiconductor region of the second transistor are geometrically arranged on top with respect to a wafer surface, while the first collector semiconductor region of the first transistor and the second emitter semiconductor region of the second transistor are geometrically arranged on the bottom with respect to the wafer surface. Another aspect of the invention is that the first collector semiconductor region of the first transistor and the second emitter semiconductor region of the second transistor, border on a buried conductive layer that electrically connects the first collector semiconductor region of the first transistor and the second emitter semiconductor region of the second transistor to one another.

The semiconductor layers of the two transistors can be epitaxially grown on the buried layer so that the buried conductive layer does not border on the surface of the wafer. However, provision can be made for the buried conductive layer to be additionally contacted by means of a metallic contact.

In an embodiment of the invention, the first transistor and the second transistor can be separated from one another by a structuring of the wafer. The structuring can be composed of an etched trench structure, for example. Preferably, at least one of the semiconductor regions of the first transistor is insulated from at least one of the semiconductor regions of the second transistor by an insulator. Silicon dioxide ($SiO_2$) preferably serves as the insulator.

In another embodiment of the invention, the insulator likewise borders on the buried conductive layer, so that none of the semiconductor regions of the first transistor border on a semiconductor region of the second transistor.

According to a further embodiment of the invention, the first transistor and the second transistor are integrated such that the pn junctions of the two transistors are essentially parallel to a surface of the wafer. The edge regions of the pn junctions are preferably delimited by an insulator, for example an oxide, so that the delimitation of the edge regions is at an angle to the surface of the wafer. Preferably, the delimitation is essentially perpendicular to the surface of the wafer.

Also, at least one of the pn junctions can be a heterojunction. It is preferred in this regard for a base-emitter junction to be the heterojunction. In this context, for example, the first base semiconductor region of the first transistor is made of a first semiconductor material, and the first emitter semiconductor region of the first transistor is made of a second semiconductor material. In this regard, the first semiconductor material and the second semiconductor material are produced such that the value of the band gap in the first semiconductor material is smaller than the value of the band gap in the second semiconductor material by at least the mean thermal energy of the charge carriers. For example, the first semiconductor material can be $Si_{1-x}Ge_x$ and the second semiconductor material can be Si.

A further embodiment of the invention provides for the first collector semiconductor region of the first transistor to have a thickness of less than 100 nm. In this context, the most favorable thickness value for high-frequency applications is 70 nm. In addition, provision is made in another embodiment for the first collector semiconductor region of the first transistor to have a dopant concentration of at least $1 \cdot 10^{17}$ cm$^{-3}$. Preferably the dopant concentration lies in the region of $7 \cdot 10^{17}$ cm$^{-3}$.

Through an additional selective implantation of dopants in the second emitter semiconductor region of the second transistor, a preferred embodiment of the invention has a dopant concentration in this semiconductor region of at least $1 \cdot 10^{18}$ cm$^{-3}$, preferably $2 \cdot 10^{18}$ cm$^{-3}$.

In further development of the invention, the first collector semiconductor region of the first transistor and the second emitter semiconductor region of the second transistor are at least partially made in the same process steps. For example, the two semiconductor regions are deposited simultaneously by means of the same epitaxy. Advantageously, the first collector semiconductor region of the first transistor and the second emitter semiconductor region of the second transistor therefore have essentially the same thickness.

On the basis of a preferred use of the first transistor in a common-emitter circuit and the second transistor in a common-base circuit, the first transistor advantageously has a lower breakdown voltage rating than the second transistor. The first transistor can thus be optimized with regard to its gain-bandwidth product. A further improvement of the high-frequency properties of the cascode is achieved by the means that the buried conductive layer has the lowest possible resistance. While it is possible in principle to use metallic conductors, it is preferred for a material to be used on which the two bipolar transistors can be epitaxially deposited. Consequently, an advantageous embodiment of the invention provides for the buried conductive layer to have highly doped silicon. The conductivity type of the buried conductive layer here corresponds to the conductivity type of the first collector semiconductor region of the first transistor and the second emitter semiconductor region of the second transistor.

In yet a further embodiment of the invention, the buried conductive layer has highly doped silicon upon which rests, at least partly between the first collector region of the first transistor and the second emitter region of the second transistor, an ohmic silicide layer connected to the buried conductive layer of highly doped silicon. Alternatively, the silicide layer can also lie on the highly doped silicon, at least in part, between the first emitter semiconductor region of the first transistor and the second collector semiconductor region of the second transistor.

Another aspect of the invention is a cascode circuit with a first transistor that is connected in a common-emitter circuit and a second transistor that is connected in a common-base circuit. A collector semiconductor region of the first transistor and an emitter semiconductor region of the second transistor border on a conductive buried layer that electrically connects the collector semiconductor region of the first transistor and the emitter semiconductor region of the second transistor. In this context, the input of the cascode circuit is connected to the base of the first transistor, while the output of the cascode circuit is connected to the collector of the second transistor. The transistors of the cascode circuit are operated at their operating points, for example, by suitable resistors.

Another aspect of the invention is the use of a cascode circuit described above with a cascade described above as an amplifying element in a high-frequency circuit. Such high-frequency circuits can be used in radio communications, for example.

Also a subject of the invention is a method for preferably vertical integration of two bipolar transistors into a cascode arrangement, in that a collector semiconductor region of a first transistor of the two bipolar transistors and an emitter semiconductor region of a second transistor of the two bipolar transistors are simultaneously applied bordering on a buried conductive layer. The two semiconductor regions are preferably grown, in one and the same epitaxy step, on an adapted lattice of the buried layer located beneath them. In an advantageous manner, a dopant is selectively implanted in the emitter semiconductor region of the second transistor in a later process step, with the collector semiconductor region of the first transistor being masked.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
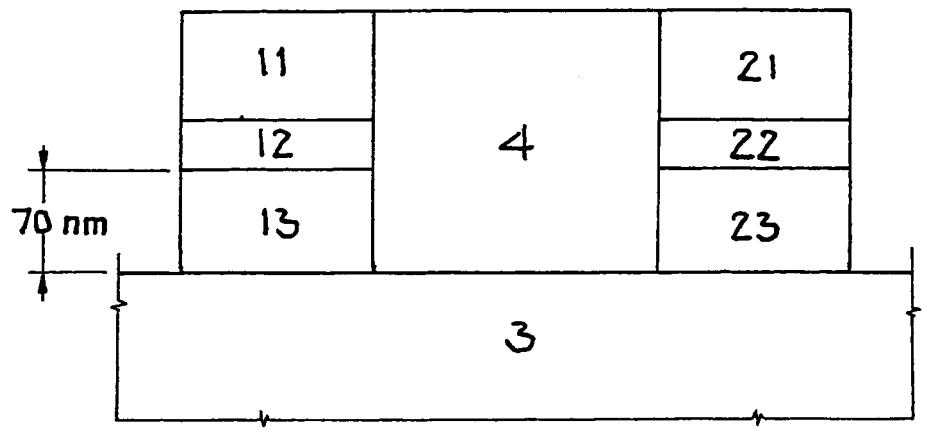
FIG. 1 is a schematic representation of an arrangement of semiconductor regions of a cascode structure.

Every semiconductor technology is optimized for a certain operating voltage range. The breakdown voltage of a transistor is primarily determined by the collector thickness and the dopant concentration in the collector semiconductor region. For a given thickness of the collector, it is impossible in this regard to exceed a certain breakdown voltage or drop below a certain cutoff frequency, regardless of the dopant concentration. The transistors available in a high-frequency technology lie within a narrow range of collector-emitter breakdown voltages above the desired operating voltage.

The dielectric strength of a cascode, and thus the voltage swing $\Delta U_C$ achievable with the cascode, is determined by the base-collector breakdown voltage of the transistor in the common-base circuit. The breakdown voltage and the voltage swing $\Delta U_C$ achievable with a cascode circuit are significantly in excess of the requirement for dielectric strength of standard components of the basic technology.

Transient characteristics and blocking capability are also important in the use of active bipolar components as amplifying elements or switches. One parameter for characterizing transient characteristics is the gain-bandwidth product $f_T$. The achievable voltage swing $\Delta U_C$ at the collector represents a parameter for blocking capability, which is inversely proportional to the level of collector doping.

In the high-frequency range, the transient characteristics are determined by the base transit time and the base charging time. At a signal transition, the base-emitter capacitance undergoes charge transfer. The higher the current density is, the faster the charge transfer will be. As a result, the gain-bandwidth product $f_T$ initially increases with increasing collector current. Once the density of the mobile charge carriers in the collector drift zone becomes comparable to the charge density of the ion cores, the effective base width increases (Kirk effect). This increases the base transit time, and the gain-bandwidth product $f_T$ drops again at high current densities.

Moreover, the current density at the onset of the Kirk effect is proportional, and the base transit time is inversely proportional, to the level of collector doping. Even when neglecting the base transit and charging times, the transit time through the base-collector space-charge zone results in a material-dependent upper limit on the Johnson product, i.e. the product of the gain-bandwidth product $f_T$ and the voltage swing $\Delta U_C$. The achievable operating frequency thus drops with increasing dielectric strength of a transistor.

On account of the low input resistance of the transistor in the common-base circuit, the driven transistor in the common-emitter circuit experiences only a small voltage swing $\Delta U_C$, so that the cascode circuit has a higher Early voltage $V_a$ for the same current gain $\beta$ as the driven transistor, and the driven transistor can be implemented as low-blocking and fast. In this case it is not necessary for the transistor in the common-emitter circuit to have a dielectric strength above that required for the target application.

For current amplification, a transistor is generally operated in a common-emitter circuit. In contrast, the blocking capability in the common-base circuit is typically three to ten times as high. Accordingly, cascode connection of a transistor as the transistor in the common-base circuit with a low-blocking driven transistor in the common-emitter circuit increases the achievable voltage swing $\Delta U_C$ and the Johnson product. Moreover, the switch to the cascode circuit reduces the Miller effect and increases the gain-bandwidth product $f_T$.

In the schematic representation of the arrangement of semiconductor regions in FIG. 1, the metallic contacts for connection and the silicon substrate are omitted to simplify the representation. Rather, the representation in FIG. 1 is limited to the areas which functionally interoperate. Starting from the wafer surface, a buried conductive layer 3 is arranged at the bottom. Arranged on this buried conductive layer 3 are a first bipolar transistor having the semiconductor layers 11, 12 and 13 and a second bipolar transistor having the semiconductor layers 21, 22 and 23, which are separated from one another by an insulator 4.

Figure 2:
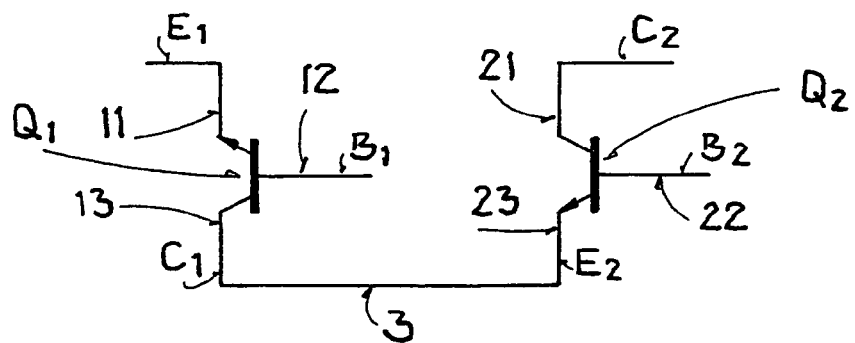
FIG. 2 is a section of a circuit associated with FIG. 1 with npn bipolar transistors.

A first variant embodiment provides for the use of npn transistors. FIG. 2 shows an associated section of a circuit. Accordingly, the first transistor Q1 has a first base semiconductor region 12, a first emitter semiconductor region 11 and a first collector semiconductor region 13, with the first collector semiconductor region 13 bordering on the buried conductive layer 3. The second transistor Q2 has a second base semiconductor region 22, a second collector semiconductor region 21 and a second emitter semiconductor region 23, with the second emitter semiconductor region 23 bordering on the buried conductive layer 3. The insulator 4 is silicon dioxide, while the buried conductive layer has highly doped silicon.

The semiconductor regions 12 and 22 here consist of p-doped silicon, while the semiconductor regions 11, 13, 21, 23 and 3 have n-doped silicon. In addition to the base connections B1 and B2 and the emitter connection E1 of the first transistor Q1 and the collector connection C2 of the transistor Q2, which are shown in FIG. 2, contact can also be made to the buried conductive layer 3 by means of a metallic contact.

In this arrangement in FIG. 1, the collector of the first transistor Q1, which has its emitter geometrically located on top, can be electrically connected directly to the emitter of the second transistor Q2, which has its emitter geometrically located on the bottom, by the buried conductive layer 3.

Since the transistors Q1 and Q2 used in FIG. 1 are only used within the cascode circuit which is integrated as an electronic component, they are not limited with respect to their dielectric strength by the fact that they must also be used as individual transistors in a common-emitter circuit in the desired voltage range. As a result of the arrangement in FIG. 1, the gain-bandwidth product $f_T$ achievable using the integrated cascode arrangement is significantly improved in comparison to a cascode circuit laterally integrated from individual components. Moreover, the arrangement in FIG. 1 requires less chip area than a lateral structure. Furthermore, parasitic capacitances and inductances are reduced as a result of shortened line segments.

Figure 3:
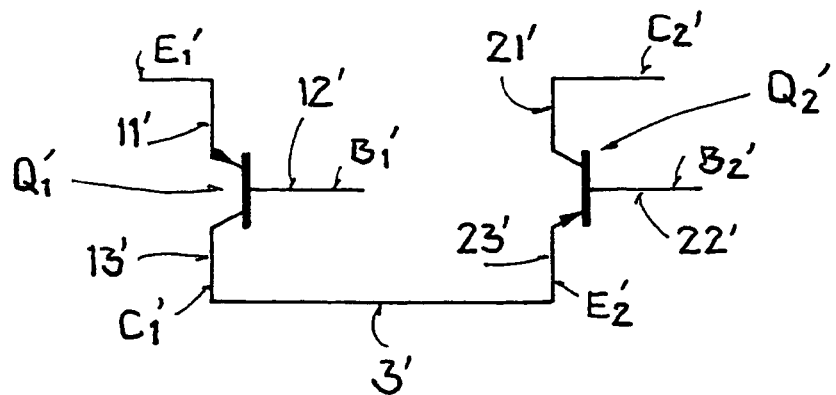
FIG. 3 is a section of a circuit associated with FIG. 1 with pnp bipolar transistors.

FIG. 3 shows a complementary arrangement with pnp bipolar transistors Q1' and Q2'. Accordingly, the semiconductor regions 11', 13', 3', 21', and 23' are p-doped. In contrast, the base semiconductor regions 12' and 22' are n-doped.

In order to produce a cascode arrangement as shown in FIG. 1, a method is provided for vertical integration of two bipolar transistors Q1 and Q2 into a cascode arrangement in that a collector semiconductor region 13 of a first transistor Q1 of the two bipolar transistors Q1 and Q2 and an emitter semiconductor region 23 of a second transistor Q2 of the two bipolar transistors Q1 and Q2 are simultaneously applied bordering on a buried conductive layer 3. Preferably, a dopant is selectively implanted in the emitter semiconductor region 23 of the second transistor Q2 in this production step, with the collector semiconductor region 13 of the first transistor Q1 being masked.

Furthermore, it is advantageous for at least one of the semiconductor regions 11, 12, 13, 23, 22 or 21 to be applied epitaxially. In this regard, provision is preferably made to apply the semiconductor layers 13 and 23 together in a single epitaxy step, so that the first collector semiconductor region 13 and the second emitter semiconductor region 23 have a thickness of 70 nm. The specification of the thickness of the first collector semiconductor region 13 in FIG. 1 does not specify thicknesses or widths of the other semiconductor layers (11, 12, 21, 22, 3) or for the insulator 4 in this context.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A cascode comprising:
    a first transistor including a first base semiconductor region, a first collector semiconductor region, and a first emitter semiconductor region; and
    a second transistor including a second base semiconductor region, a second collector semiconductor region, and a second emitter semiconductor region,
    wherein the first collector semiconductor region of the first transistor and the second emitter semiconductor region of the second transistor border on a buried conductive layer that electrically connects the first collector semiconductor region of the first transistor and the second emitter semiconductor region of the second transistor with one another, and the second collector semiconductor region comprises a cascode output and the first base semiconductor region comprises a cascode input.

2. The cascade according to claim 1, wherein the first transistor and the second transistor are separated from one another by a first wafer structure.

3. The cascade according to claim 1, wherein, at least one of the semiconductor regions of the first transistor is insulated from at least one of the semiconductor regions of the second transistor by an insulator.

4. The cascade according to claim 3, wherein the insulator borders on the buried conductive layer.

5. The cascade according to claim 1, wherein the first transistor and the second transistor are vertically integrated such that pn junctions of the two transistors are substantially parallel to a surface of a wafer.

6. A cascode comprising:
    a first transistor including a first base semiconductor region, a first collector semiconductor region, and a first emitter semiconductor region; and
    a second transistor including a second base semiconductor region, a second collector semiconductor region, and a second emitter semiconductor region,
    wherein the first collector semiconductor region of the first transistor and the second emitter semiconductor region of the second transistor border on a buried conductive layer that electrically connects the first collector semiconductor region of the first transistor and the second emitter semiconductor region of the second transistor with one another, and the first transistor and the second transistor are vertically integrated such that on junctions of the two transistors are substantially parallel to a surface of a wafer, and wherein at least one of the pn junctions is a heterojunction.

7. The cascode according to claim 1, wherein at least one of the semiconductor regions of the first or second transistor is applied epitaxially.

8. A cascode comprising:
   a first transistor including a first base semiconductor region, a first collector semiconductor region, and a first emitter semiconductor region; and
   a second transistor including a second base semiconductor region, a second collector semiconductor region, and a second emitter semiconductor region,
   wherein the first collector semiconductor region of the first transistor and the second emitter semiconductor region of the second transistor border on a buried conductive layer that electrically connects the first collector semiconductor region of the first transistor and the second emitter semiconductor region of the second transistor with one another,
   wherein the first collector semiconductor region of the first transistor has a thickness of less than 100 nm.

9. A cascode comprising:
   a first transistor including a first base semiconductor region, a first collector semiconductor region, and a first emitter semiconductor region; and
   a second transistor including a second base semiconductor region, a second collector semiconductor region, and a second emitter semiconductor region,
   wherein the first collector semiconductor region of the first transistor and the second emitter semiconductor region of the second transistor border on a buried conductive layer that electrically connects the first collector semiconductor region of the first transistor and the second emitter semiconductor region of the second transistor with one another,
   wherein the first collector semiconductor region of the first transistor has a dopant concentration of at least $1 \cdot 10^{17}$ cm$^{-3}$.

10. A cascode comprising:
    a first transistor including a first base semiconductor region, a first collector semiconductor region, and a first emitter semiconductor region; and
    a second transistor including a second base semiconductor region, a second collector semiconductor region, and a second emitter semiconductor region,
    wherein the first collector semiconductor region of the first transistor and the second emitter semiconductor region of the second transistor border on a buried conductive layer that electrically connects the first collector semiconductor region of the first transistor and the second emitter semiconductor region of the second transistor with one another,
    wherein the second emitter semiconductor region of the second transistor has a dopant concentration of at least $1 \cdot 10^{18}$ cm$^{-3}$.

11. The cascade according to claim 1, wherein the first collector semiconductor region of the first transistor and the second emitter semiconductor region of the second transistor are at least partially made in the same process steps.

12. The cascode according to claim 1, wherein the first collector semiconductor region of the first transistor and the second emitter semiconductor region of the second transistor have substantially the same thickness.

13. The cascode according to claim 1, wherein the first transistor has a lower breakdown voltage rating than the second transistor.

14. The cascode according to claim 1, wherein the buried conductive layer has highly doped silicon.

15. A cascode comprising:
    a first transistor including a first base semiconductor region, a first collector semiconductor region, and a first emitter semiconductor region; and
    a second transistor including a second base semiconductor region, a second collector semiconductor region, and a second emitter semiconductor region,
    wherein the first collector semiconductor region of the first transistor and the second emitter semiconductor region of the second transistor border on a buried conductive layer that electrically connects the first collector semiconductor region of the first transistor and the second emitter semiconductor region of the second transistor with one another, and
    wherein the buried layer has highly doped silicon upon which rests, at least partly between the first collector semiconductor region of the first transistor and the second emitter semiconductor region of the second transistor, or between the first emitter semiconductor region of the first transistor and the second collector semiconductor region of the second transistor, an ohmic silicide layer connected to the buried conductive layer of highly doped silicon.

16. A cascode comprising:
    a first transistor including a first base semiconductor region, a first collector semiconductor region, and a first emitter semiconductor region; and
    a second transistor including a second base semiconductor region, a second collector semiconductor region, and a second emitter semiconductor region,
    wherein the first emitter semiconductor region of the first transistor and the second collector semiconductor region of the second transistor are geometrically arranged on top with respect to a wafer surface, and
    wherein the first collector semiconductor region of the first transistor and the second emitter semiconductor region of the second transistor are geometrically arranged on a bottom with respect to the wafer surface, and the second collector semiconductor region comprises a cascode output and the first base semiconductor region comprises a cascode input.

17. A cascode circuit comprising:
    a first transistor, which is connected in a common-emitter circuit; and
    a second transistor, which is connected in a common-base circuit,
    wherein a collector semiconductor region of the first transistor and an emitter semiconductor region of the second transistor border on a conductive buried layer that electrically connects the collector semiconductor region of the first transistor and the emitter semiconductor region of the second transistor with one another,
    wherein the buried layer has highly doped silicon upon which rests, at least partly between the first collector semiconductor region of the first transistor and the second emitter semiconductor region of the second transistor, or between the first emitter semiconductor region of the first transistor and the second collector semiconductor region of the second transistor, an ohmic silicide layer connected to the buried conductive layer of highly doped silicon.

18. The cascode circuit according to claim 17, wherein the cascode circuit is an amplifying element in a high-frequency circuit.

19. The cascade according to claim 3, wherein the insulator is silicon dioxide ($SiO_2$).

20. The cascade according to claim 8, wherein the first collector semiconductor region of the first transistor has a thickness of less than 70 nm.

21. The cascade according to claim 9, wherein the first collector semiconductor region of the first transistor has a dopant concentration of at least $7 \cdot 10^{17}$ $cm^{-3}$.

22. The cascade according to claim 10, wherein the second emitter semiconductor region of the second transistor has a dopant concentration of at least $2 \cdot 10^{18}$ $cm^{-3}$.

23. A cascade circuit comprising:
   a first transistor, which is connected in a common-emitter circuit; and
   a second transistor, which is connected in a common-base circuit,
   wherein a collector semiconductor region of the first transistor and an emitter semiconductor region of the second transistor border on a conductive buried layer that electrically connects the collector semiconductor region of the first transistor and the emitter semiconductor region of the second transistor with one another, and
   wherein a collector semiconductor region of the second transistor connected in a common-base circuit provides a cascade output and a base semiconductor region of the first transistor connected in the common-emitter circuit provides a cascade input.

* * * * *